United States Patent
Colgan et al.

(10) Patent No.: US 9,437,515 B2
(45) Date of Patent: Sep. 6, 2016

(54) HEAT SPREADING LAYER WITH HIGH THERMAL CONDUCTIVITY

(71) Applicant: International Business Machines Corporation, Armonk, NY (US)

(72) Inventors: Evan G. Colgan, Chestnut Ridge, NY (US); Taryn J. Davis, Beacon, NY (US); Chenzhou Lian, Poughquag, NY (US); Yi Pan, Poughkeepsie, NY (US); Kamal K. Sikka, Poughkeepsie, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/838,524

(22) Filed: Aug. 28, 2015

(65) Prior Publication Data

US 2015/0371919 A1    Dec. 24, 2015

Related U.S. Application Data

(62) Division of application No. 13/848,960, filed on Mar. 22, 2013.

(51) Int. Cl.
| | |
|---|---|
| *H01L 23/367* | (2006.01) |
| *H01L 23/34* | (2006.01) |
| *H01L 23/373* | (2006.01) |
| *H01L 23/36* | (2006.01) |
| *H05K 7/20* | (2006.01) |

(Continued)

(52) U.S. Cl.
CPC .............. *H01L 23/34* (2013.01); *H01L 23/36* (2013.01); *H01L 23/367* (2013.01); *H01L 23/373* (2013.01); *H05K 7/20509* (2013.01); *H01L 24/16* (2013.01); *H01L 24/32* (2013.01); *H01L 24/48* (2013.01); *H01L 24/73* (2013.01); *H01L 25/0655* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73215* (2013.01); *H01L 2224/73253* (2013.01); *H01L 2224/73265* (2013.01); *H01L 2924/3511* (2013.01)

(58) Field of Classification Search
CPC ... H01L 23/34; H01L 23/36; H01L 23/3672; H01L 23/3677; H01L 23/49568; H01L 31/052; H01L 2224/05293; H01L 2224/05393; H01L 2224/05493; H01L 2224/05693

See application file for complete search history.

(56) References Cited

U.S. PATENT DOCUMENTS

| | | |
|---|---|---|
| 4,867,235 A | 9/1989 | Grapes et al. |
| 6,154,369 A | 11/2000 | Martinez et al. |

(Continued)

FOREIGN PATENT DOCUMENTS

CN    102187751 A    9/2011

*Primary Examiner* — Jasmine Clark
(74) *Attorney, Agent, or Firm* — Steven J. Meyers; Howard M. Cohn (57) ABSTRACT

Embodiments of the invention comprise a homogeneous heat spreading cap element in chip packages to facilitate better heat spreading and dissipation. The heat spreading cap comprises a single high-K graphite layer supported by a copper frame for increased stability and reduced thermal warpage during handling and operation while minimizing thermal penalty by reducing the amount of material having a relatively low heat conductivity that is needed in conventional heat spreading caps.

1 Claim, 7 Drawing Sheets

(51) Int. Cl.
  *H01L 23/00* (2006.01)
  *H01L 25/065* (2006.01)

(56) References Cited

U.S. PATENT DOCUMENTS

| | | | |
|---|---|---|---|
| 6,265,771 B1 * | 7/2001 | Ference | H01L 23/36 257/706 |
| 6,462,410 B1 | 10/2002 | Novotny et al. | |
| 6,475,327 B2 | 11/2002 | Tung et al. | |
| 6,758,263 B2 | 7/2004 | Krassowski et al. | |
| 6,898,084 B2 | 5/2005 | Misra | |
| 7,250,576 B2 | 7/2007 | Colgan et al. | |
| 7,498,673 B2 | 3/2009 | Awad et al. | |
| 7,683,479 B2 | 3/2010 | Yazawa | |
| 7,900,690 B2 | 3/2011 | Hawwa et al. | |
| 2005/0039879 A1 | 2/2005 | Hanai | |
| 2006/0214286 A1 | 9/2006 | Sir et al. | |
| 2007/0062676 A1 | 3/2007 | Yao | |
| 2007/0117270 A1 | 5/2007 | Renavikar et al. | |
| 2008/0290505 A1 | 11/2008 | Kolan et al. | |
| 2008/0305584 A1 * | 12/2008 | Foong | H01L 23/36 438/122 |
| 2009/0127700 A1 | 5/2009 | Romig | |
| 2010/0078807 A1 | 4/2010 | Schulz | |
| 2010/0295172 A1 | 11/2010 | Gao et al. | |
| 2010/0327430 A1 | 12/2010 | Jadhav et al. | |
| 2011/0073294 A1 | 3/2011 | MacDonald et al. | |

* cited by examiner

HEAT SPREADING LAYER WITH HIGH THERMAL CONDUCTIVITY

CROSS REFERENCE TO RELATED APPLICATIONS

This application is a division of commonly-owned, copending U.S. patent application Ser. No. 13/848,960 entitled HEAT SPREADING LAYER WITH HIGH THERMAL CONDUCTIVITY, and filed on Mar. 22, 2013.

FIELD OF THE INVENTION

This invention relates generally to the field of controlling thermal conduction in computer chip packaging, and more specifically to a heat spreading cap structure having high thermal conductivity.

BACKGROUND

Innovations in semiconductor fabrication and packaging technologies have enabled development of high performance, densely integrated semiconductor chip modules. The downscaling of chip geometries and the increase in operating speeds lead to increased power densities, resulting in more heat generation per unit area. The increased power density poses practical limitations to the level of integration density and performance that may be achieved. The ability to implement chip modules with higher densities and higher performance is limited primarily by the ability to effectively cool the chip modules during normal operation. For instance, as heat is generated by integrated circuit ("IC") chips during normal operation, cooling structures must be employed to provide sufficiently low thermal resistance paths between the chips and ambient air or a circulating liquid coolant to adequately remove heat and maintain the operating temperature of the chips low enough to assure continued reliable operation.

In conventional packaging technologies, chip level packages can be constructed with one or more chips mounted on a thin flexible first level package substrate, such as an organic laminate build up package substrate, using micro solder bump connections, referred to as C4's (controlled collapse chip connection). The packages are often bonded to a cap, which provides structural stability to the package by reducing warpage, and by spreading heat along a plane, thereby improving the package thermal performance. The cap, in turn, is attached to a secondary cooling structure, such as a heat sink or a liquid cooling system.

Figure 1:
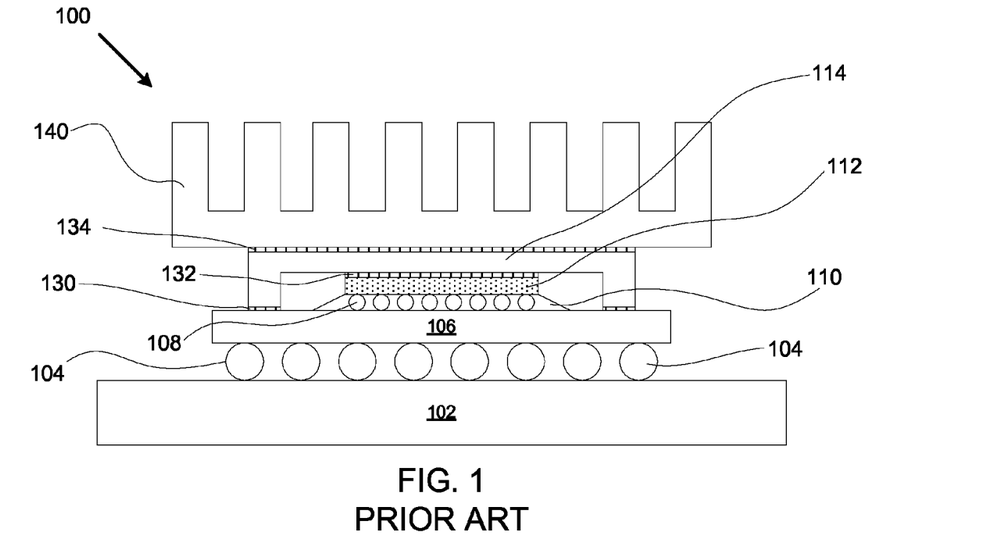
FIG. 1 is a cross sectional front elevational view of a flip chip ball grid array package assembly, according to the prior art.

Referring now to FIG. 1, a flip chip ball grid array (BGA) package 100, according to the prior art, comprises a chip die 112 having an operational surface mounted onto a substrate 106 via a series of C4's 108 encased in an underfill layer 110. These components are operatively connected to a circuit board 102 via a separate series of solder balls 104. The die 112 is said to be flipped because its operational connections face down towards the substrate 106 and the circuit board 102, and its other side is connected to a heat sink 140 via a protective heat spreading cap 114. Several layers of the package 100 are connected using layers of material, including, for example, the thermal interface material (TIM1) 132 connecting the die 112 to the cap 114, the adhesive layer 130 connecting the cap 114 to the substrate 106, and the thermal interface material (TIM2) 134 connecting the cap 114 the heat sink 140.

In conventional implementations, the heat spreading cap 114 may be made from copper, having a thermal conductivity of 400 W/m-° C., at 300° K. Although copper has relatively high structural stability and extends that stability to the package 100, it is not the most thermally conductive material available. Some forms of graphite, for example, have much higher thermal conductivity across at least one spatial plane. Other forms of graphite exhibit thermal conductivity above 1200 W/m-° C. These materials generally are referred to as high-k materials, or high-k graphite.

According to an aspect of the prior art (for example, as disclosed by U.S. Pat. No. 6,758,263 B2 entitled "HEAT DISSIPATING COMPONENT USING HIGH CONDUCTIVE INSERTS"), a heterogeneous planar graphite element includes a high-conductivity graphite layer having a cavity for housing an insert. The graphite layer exhibits high thermal conductivity in the x and y planes, but low thermal conductivity in the z plane. The insert layer has relatively higher thermal conductivity across the z plane, but not across the x or y planes.

Traditional designs and methods in the prior art face significant challenges, particularly because known structures using high-k material exhibit weak structural stability, and experience warpage under normal operating temperatures. This warpage leads to device defects and even to device failure. In fact, the relative instability of these structures also makes more prone to damage during manufacturing processes. Furthermore, prior art solutions using graphite employ one or more heterogeneous layers, adding to device complexity but taking advantage of graphite's thermal conductivity in a limited way.

Therefore, it is desirable to manage heat spreading and dissipation in semiconductor packaging technology by taking advantage of the relatively high thermal conductivity of available material, such as graphite, while at the same time maintaining structural integrity of the package and its constituent components.

SUMMARY

Embodiments of the invention include a cooling system for a semiconductor package comprising a heat spreading layer partially encased in a supporting frame along an outer perimeter, the supporting frame encasing the perimeter and an adjacent portion of the heat spreading layer to define centrally exposed top and bottom portions of the heat spreading layer; and a heat generating element thermally connected to the centrally exposed bottom portion of the heat spreading layer.

BRIEF DESCRIPTION OF THE DRAWINGS

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Figure 2:
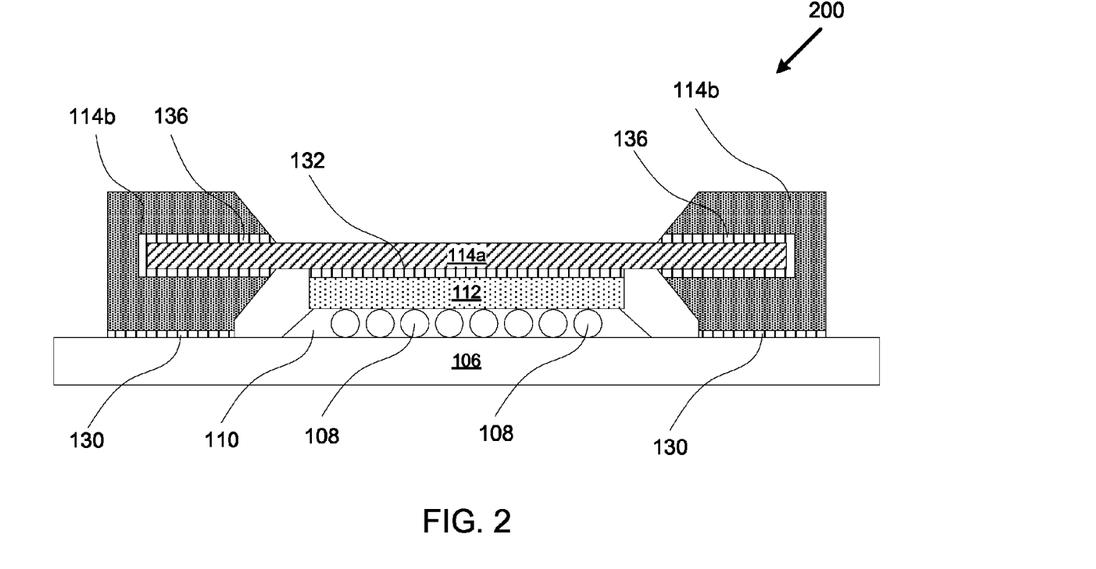
FIG. 2 is a partial cross sectional front elevational view of a flip chip package assembly, having a heat spreading layer encased in a supporting frame, wherein the supporting frame extends over a portion of the heat spreading layer, according to an embodiment of the disclosed invention.

Referring now to FIG. 2, a subset 200 of a flip chip package, according to an embodiment of the disclosed invention, comprises a chip die 112 mounted onto a substrate 106 via a series of C4's 108 encased in an underfill layer 110. A top surface of the chip die 112 is connected to a lid comprising a homogeneous, thermally conductive heat spreading layer 114a housed within a supporting frame 114b. A bottom surface of the heat spreading layer 114a is connected to the top surface of the chip die 112 via a thermal interface material ("TIM1") 132. A bottom surface of the supporting frame 114b is connected to the top surface of the substrate 106 via an adhesive layer 130. The heat spreading layer 114a and the interior cavity of the supporting frame 114b are also connected via an adhesive layer 136. The purpose the adhesive layer 136 is, in part, to form a strong interaction between the heat spreading layer 114a and the supporting frame 114b, and to maintain the integrity of these two components, particularly in light of structural stresses, such as heat fluctuations, exerted upon the chip package during manufacturing and operation. One example of the material that can be used to form the layer 136 is epoxy based adhesive.

Further referring to FIG. 2, the supporting frame 114b is formed as a single piece, as is the heat spreading layer 114a. It is not necessary to bond these two components via the adhesive layer 136, particularly if the supporting frame 114b is molded onto and around the heat spreading layer 114a during the fabrication process. According to an aspect of the disclosed invention, the heat spreading layer 114a is made from a material having relatively high thermal conductivity, such as graphite, some forms of which exhibit conductivity above 1200 W/m-° C.

The graphite heat spreading layer 114a is effective in spreading heat generated by the chip die 112 and its surrounding components across the z plane, and at least one of the x or y planes. By using a high-k material such as graphite, the heat spreading layer 114a provides greater heat spreading and dissipation compared to the prior art where a customary choice of chip cap/lid material is copper. In fact, the graphite heat spreading layer 114a has double the thermal conductivity of copper given an equal shape and thickness. Consequently, it is a suitable choice for forming the heat spreading layer 114a.

According to an aspect of the disclosed invention, the graphite heat spreading layer 114a may be formed using two smaller graphite pieces joined at two adjacent edges by an adhesive (not shown) to form a single planar graphite layer. Each pyrolytic graphite piece may be grown to a thickness of about 25 mm, where its high thermal conductivity is in the horizontal plane and its low thermal conductivity is in the vertical, or growth, direction. Thereafter, each piece is orientated such that the low thermal conductivity of the graphite is in the x direction. A 50×50 mm graphite heat spreader may be constructed by cutting out two pieces that are 25 mm tall, 4 mm thick, and 50 mm long where the thermal conductivity is high in the 4 mm and 50 mm directions. These pieces are glued together side-by-side (i.e. by joining their respective 4×50 mm faces) to produce the 50×50×4 mm single, planar layer heat spreader. Other embodiments of the invention may have additional pieces in the single planar layer and oriented and joined in a manner different from the described configuration, without departing from the scope or the spirit of the invention.

Although graphite has desirable high thermal conductivity, it is generally susceptible to thermal warpage and cracking or breaking during device operation. Failure of the heat spreading layer 114a due to warpage in typical operational conditions may be virtually eliminated by encasing it in the supporting frame 114b. According to an embodiment of the invention, the supporting frame 114b is made from copper, and encompasses the side, and parts of the top and bottom surfaces of the layer 114a, leaving a central portion of both the top and bottom surfaces of the graphite exposed. By retaining an exposed portion of graphite, the heat spreading layer 114a remains twice as effective as conventional copper caps in thermal conductivity at the exposed area. The supporting frame 114b gives the heat spreading layer 114a sufficient rigidity at its outer surfaces and edges without creating a thermal penalty at its exposed regions.

Other embodiments may employ other metals, such as stainless steel, or polymers that are sufficiently strong to provide structural stability to the highly conductive layer 114a.

Figure 3:
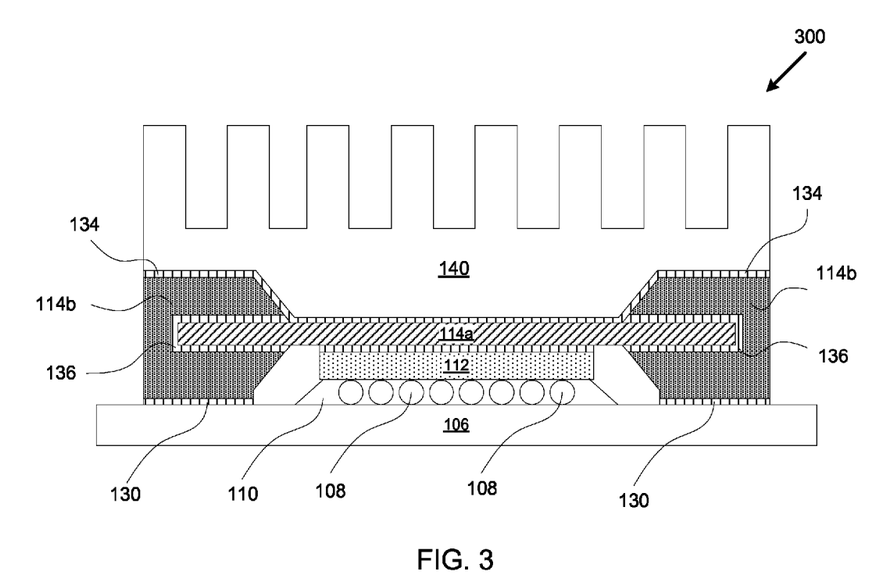
FIG. 3 is a cross sectional front elevational view of the flip chip package assembly depicted in FIG. 2, and further depicts a heat sink, according to an embodiment of the disclosed invention.

Referring now to FIG. 3, a subset 300 of a flip chip package is similar to the elements recited above in connection with FIG. 2, wherein like elements have been similarly marked. Additionally, the subset 300 comprises a heat sink 140 having a bottom surface contoured to fit into the opening of the exposed area of the top surface of the heat spreading layer 114a and the top surface of the frame 114b, via a TIM2 layer 134. Contouring the bottom surface of the heat sink 140 to the top surface of the lid is beneficial because it fills a gap that would otherwise form between the heat sink 140 and the top surface of the heat spreading layer 114a due to the asymmetrical shapes of the two surfaces. Without contouring the bottom surface of the heat sink 140, the gap may be filled with a TIM2 layer, a solution that likely would create an increased thermal penalty.

Figure 4:
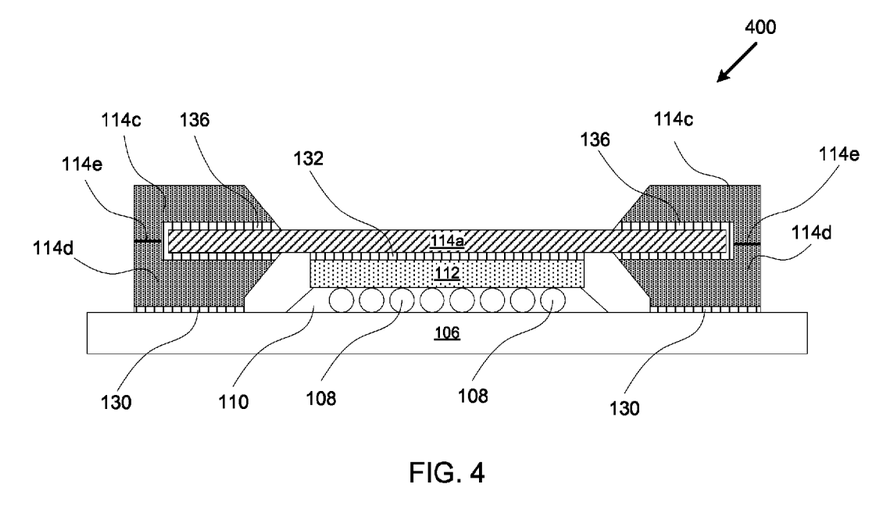
FIG. 4 is a cross sectional front elevational view of the flip chip package assembly depicted in FIG. 2, wherein the supporting frame comprises a plurality of interconnected pieces, according to an embodiment of the disclosed invention.

Referring now to FIG. 4, a further embodiment of the disclosed invention comprises a subset 400 of a flip chip package, as described and depicted in FIG. 2. Additionally, rather than using a single-piece supporting frame (the supporting frame 114b as shown in FIG. 2), the supporting frame of the subset 400 comprises a top frame 114c and a foot frame 114d, joined at a junction point 114e. The two layers may be joined using an adhesive layer (not shown), or mechanically. Embodiments of the disclosed invention may comprise top frames 114c and foot frames 114d made from, for example, copper or stainless steel.

Further referring to FIG. 4, the design of the two-piece supporting frame (114c and 114d) may be used where manufacturing considerations make it less desirable to form a single piece frame. For example, it may not be feasible to implement a molding mechanism that would form a single-piece frame around the layer 114a due to equipment cost, or the unavailability of a polymer ideal for manufacturing a molded frame.

Figure 5:
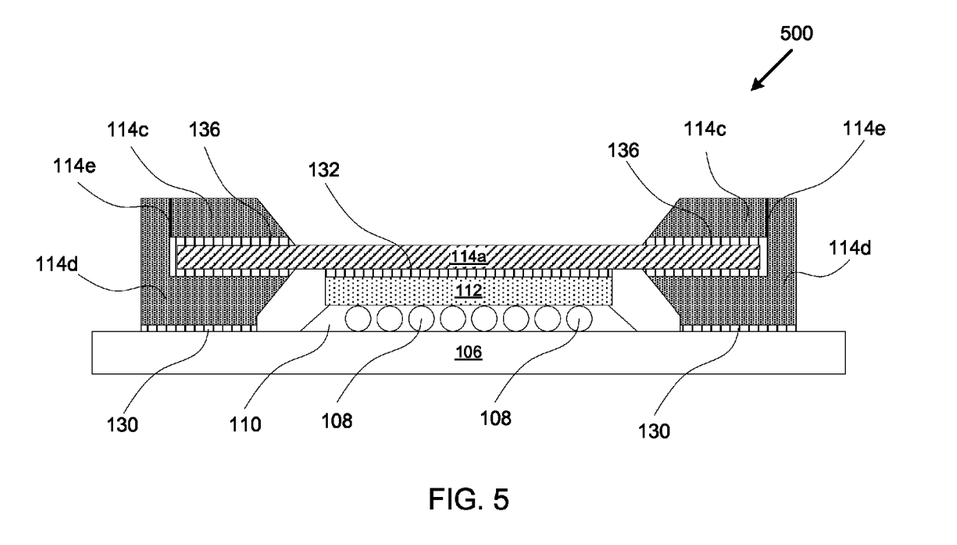
FIG. 5 is a cross sectional front elevational view of the flip chip package assembly depicted in FIG. 2, wherein the supporting frame comprises a plurality of interconnected pieces, according to an embodiment of the disclosed invention.

Referring now to FIG. 5, a subset 500 of a flip chip package, according to an embodiment of the disclosed invention, comprises the elements recited and described with respect to FIG. 4, except that the junction point 114e between the top frame 114c and the foot frame 114d is vertically aligned with the outer edges of the heat spreading layer 114a, and the foot frame 114d forms an "L" shape in a cross sectional view.

Further referring to FIGS. 4 and 5, the position of the junction point 114e may be changed according to cost, ease of design, and other manufacturing considerations, without departing from the spirit and scope of the disclosed invention.

Figure 6:
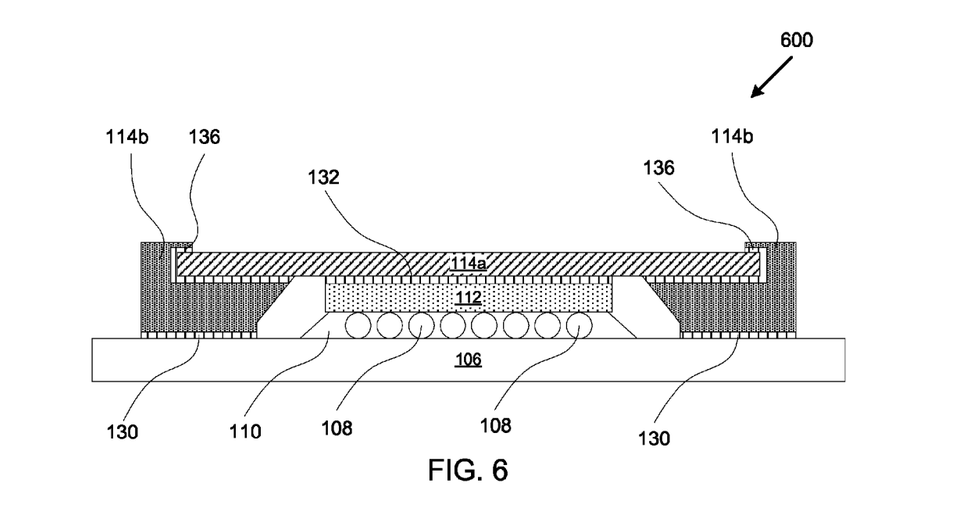
FIG. 6 is a partial cross sectional front elevational view of a flip chip package assembly, having a heat spreading layer encased in a supporting frame, wherein the supporting frame extends over a portion of the heat spreading layer, according to an embodiment of the disclosed invention.

Referring now to FIG. 6, a further embodiment of the disclosed invention comprises a subset 600 of a flip chip package, as described in connection with FIG. 2. In the disclosed embodiment, the supporting frame 114b is a single piece having a top portion that is substantially thinner than the side or foot portions of the structure. Moreover, the top portion of the supporting frame 114b extends onto the top surface of the heat spreading layer 114a at a fraction of the distance it covers on the bottom surface of the heat spreading layer 114a. Consequently, the disclosed embodiment allows for greater spreading and dissipation of heat generated by the chip die 112 by allowing a larger surface area of the heat spreading layer 114a to connect to a heat sink.

Figure 7:
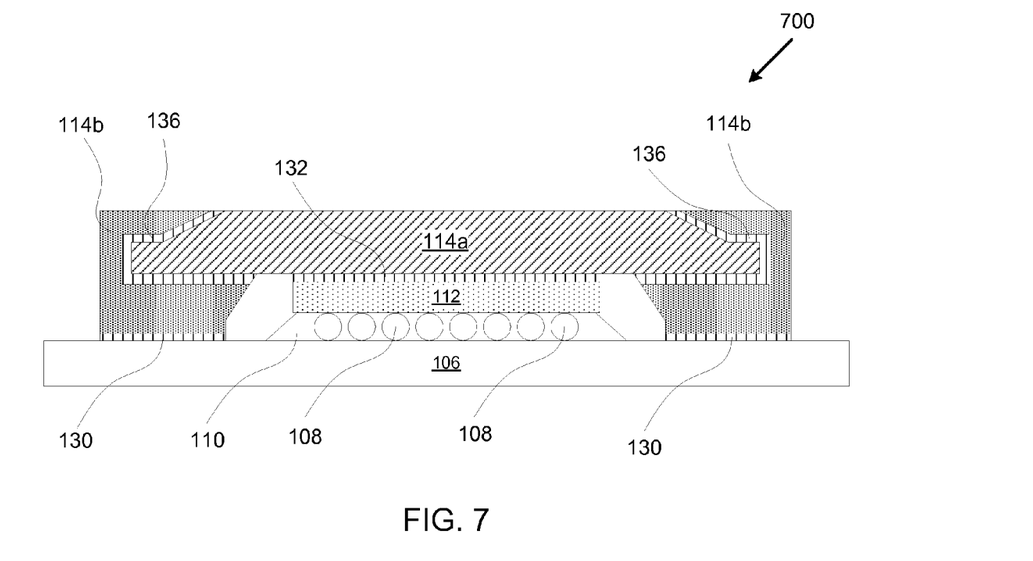
FIG. 7 is a partial cross sectional front elevational view of a flip chip package assembly, having a heat spreading layer encased in a supporting frame, wherein the edges of a top surface of the heat spreading layer are chamfered, and a top surface of the supporting frame is flush with a top surface of the heat spreading layer, according to an embodiment of the disclosed invention.

Referring now to FIG. 7, a further embodiment of the disclosed invention comprises a subset 700 of a flip chip package, as recited and described with respect to FIG. 2. In the depicted embodiment, the top surface of the heat spreading layer 114a is chamfered such that the frame 114b extends over a portion of the layer 114a. The top surface of the supporting frame 114b is flush with a central portion of the top surface of the heat spreading layer 114a, and extends over its chamfered edges. The bottom surface of the heat spreading layer 114a is substantially flat. Chamfering the heat spreading layer 114a increases the surface area at which the supporting frame 114b contacts the heat spreading layer 114a, improving the supporting frame's 114b grip, without necessarily reducing the surface area of the heat layer 114a that remains exposed. Since the exposed portion of the heat spreading layer 114a contacts the heat sink 140, it is desirable to maintain as much contact area as possible. Moreover, according to the disclosed embodiment, the heat sink 140 has a flat bottom surface, since the layer 114a is flush with the supporting frame 114b.

Figure 8:
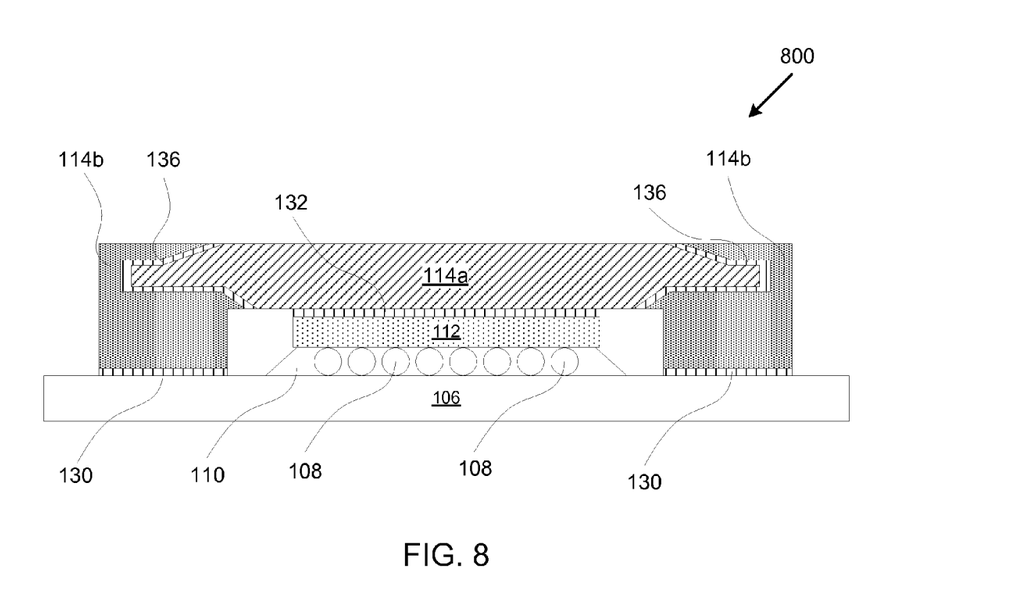
FIG. 8 is a partial cross sectional front elevational view of a flip chip package assembly, having a heat spreading layer encased in a supporting frame, wherein the edges of a top and a bottom surface of the heat spreading layer are chamfered, and a top surface of the supporting frame is flush with a top surface of the heat spreading layer, according to an embodiment of the disclosed invention.

Referring now to FIG. 8, a further embodiment of the disclosed invention comprises a subset 800 of a flip chip package, as recited and described with respect to FIG. 2. In the depicted embodiment, the heat spreading layer 114a is chamfered along its top surface, and housed within the supporting frame 114b, as depicted in FIG. 7, and described in connection therewith. Additionally, the bottom surface of the heat spreading layer 114a is also chamfered along its outer edges, with the supporting frame 114b extending over the chamfered edges. In the depicted embodiment, the chamfered surface on the top surface of the heat spreading layer 114a is larger than the chamfered surface of the bottom surface.

Figure 9:
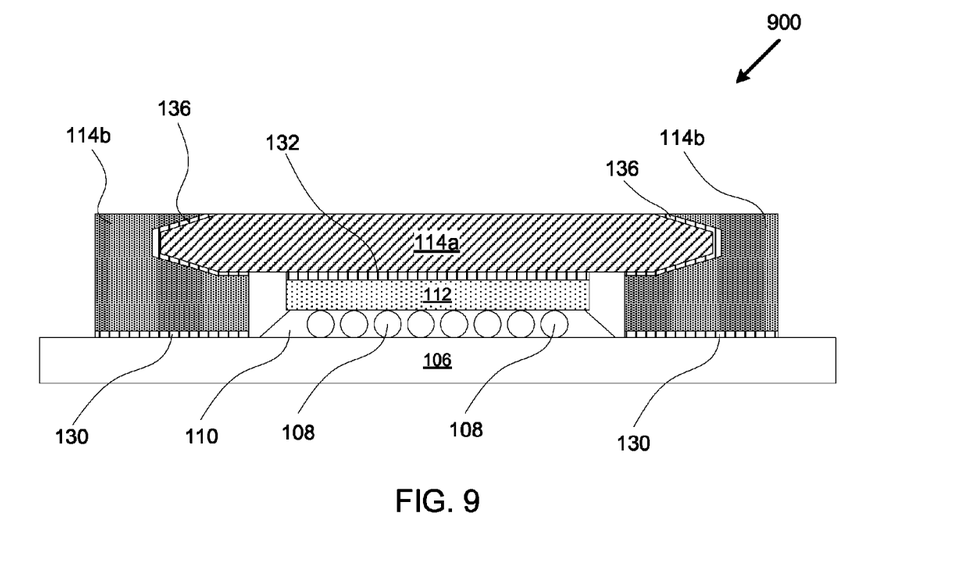
FIG. 9 is a partial cross sectional front elevational view of a flip chip package assembly, having a heat spreading layer encased in a supporting frame, wherein the edges of a top and bottom surface of the heat spreading layer are chamfered, and a top surface of the supporting frame is flush with a top surface of the heat spreading layer, according to an embodiment of the disclosed invention.

Referring now to FIG. 9, a further embodiment of the disclosed invention comprises a subset 900 of a flip chip package, as recited and described with respect to FIG. 2. Furthermore, in the depicted embodiment, the top and bottom surfaces of the heat spreading layer 114a are symmetrically chamfered and encased by the supporting frame 114b. The top surface of the supporting frame 114b is flush with a central portion of the top surface of the heat spreading layer 114a.

Figure 10:
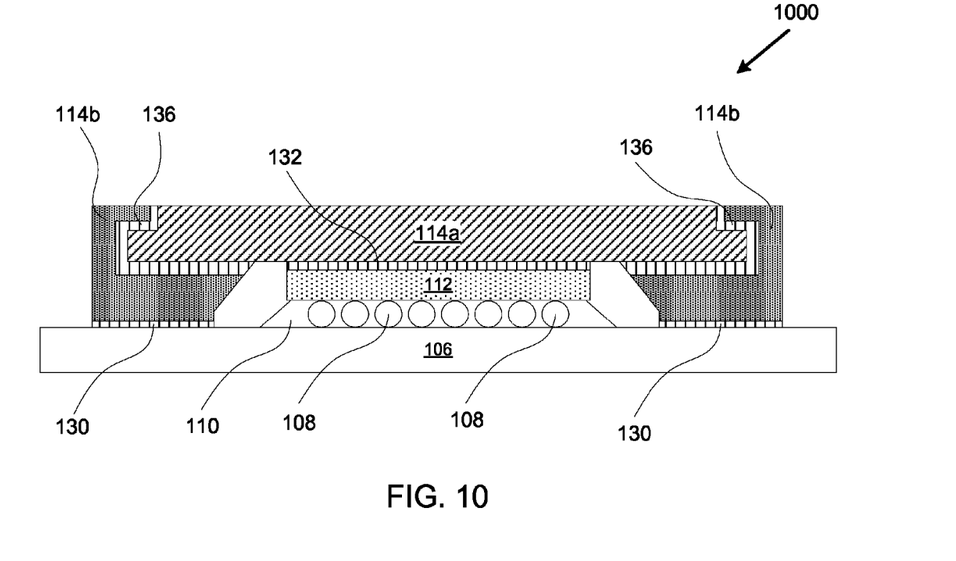
FIG. 10 is a partial cross sectional front elevational view of a flip chip package assembly, having a heat spreading layer encased in a supporting frame, wherein the edges of a top surface of the heat spreading layer are modified to form a rabbet, and a central portion of a top surface of the supporting frame is flush with the top surface of the heat spreading layer, according to an embodiment of the disclosed invention.

Referring now to FIG. 10, a further embodiment of the disclosed invention comprises a subset 1000 of a flip chip package, as recited and described with respect to FIG. 2. Furthermore, in the depicted embodiment, the top surface of the heat spreading layer 114a is processed to form rabbet edges, and encased in the supporting frame 114b, such that the supporting frame 114b extends over the rabbet edges. Moreover, the top surface of the supporting frame 114b is flush with a central portion of the top surface of the heat spreading layer 114a.

Figure 11:
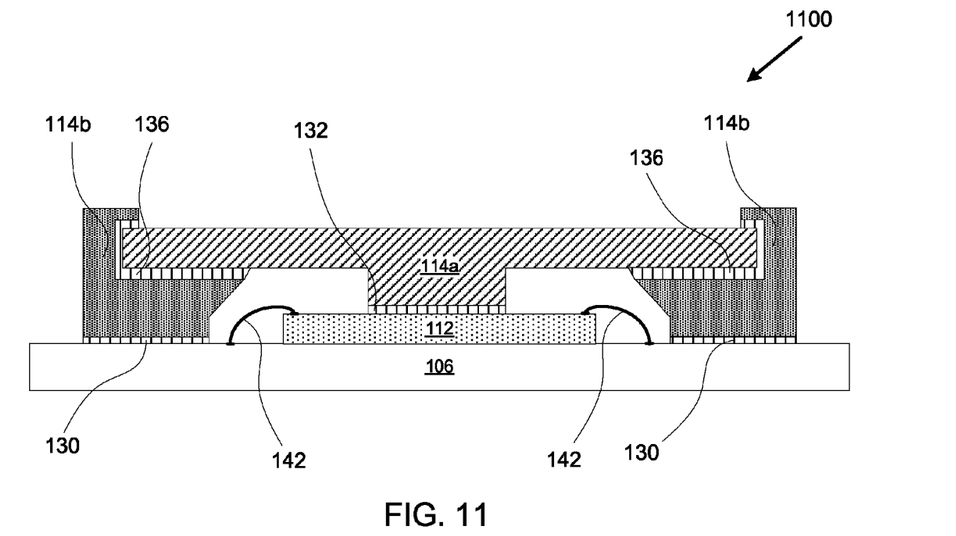
FIG. 11 is a partial cross sectional front elevational view of a wire bonding chip assembly package, having a heat spreading layer encased in a supporting frame, wherein the supporting frame extends over a portion of the heat spreading layer, and central portion of a bottom surface of the heat spreading layer is connected to a central portion of a chip, according to an embodiment of the disclosed invention.

Referring now to FIG. 11, a further embodiment of the disclosed invention comprises a subset 1100 of a wire bonding chip assembly package similar to the flip chip assembly package depicted in FIG. 6, wherein like elements are similarly referenced. However, according to the depicted embodiment, the heat spreading layer 114a further comprises a protruding central portion on its lower surface, whereby the heat spreading layer 114a connects to a central portion of a top surface of the chip 112. The chip 112 is operatively connected to the substrate layer 106 via a plurality of wire connections 142, with the active side of the chip 112 facing the heat spreading layer 114a. According to the depicted embodiment, the heat spreading layer 114a is in contact with a central region of the top surface of the chip 112 so as to provide space for the wire connections 142 in a typical wire bonding package. The wire connections 142 may be encapsulated in a molding compound.

Although the embodiments depicted in FIGS. 2-11 reference an adhesive layer 136 connecting the heat spreading layer 114a to the supporting frame 114b (or to the top frame 114c and the foot frame 114d in embodiments having a two-piece frame), forming the adhesive layer 136 is not necessary to practice the invention. Whether the adhesive layer 136 is used and at what thickness may be varied without departing from the spirit or the scope of the disclosed invention.

Furthermore, although the embodiments of the disclosed invention depicted in FIGS. 2-10 are based primarily on a flip chip package, it will be understood by a person of ordinary skill in the art, in light of the present disclosure, that the features of the depicted embodiments (including, without limitation, the shape of the heat spreading layer 114a or the supporting frame 114b) can be incorporated into corresponding embodiments using a wire bonding assembly package, as described with respect to FIG. 11, without departing from the spirit or scope of the disclosed invention.

In addition, although the embodiments of the disclosed invention depicted in FIGS. 2-11 are discussed in reference to the package 100 using BGA interconnections between the substrate 106 and the circuit board 102, as depicted in FIG. 1, these embodiments can be incorporated into a land grid array (LGA) package or a pin grid array (PGA) package. In contrast to a BGA package, wherein the substrate 106 is electrically connected to the circuit board 102 via a grid of solder ball connections 104, LGA packages use surface contact areas on the underside of the substrate 106 to connect to a corresponding grid of contacts on the circuit board 102. The connection may be implemented using a variety of methods such as LGA sockets, or solder paste. The substrate 106 surface contacts in LGA packages are relatively flat compared to the solder ball connections in BGA packages. In PGA packages, the surface contacts on the underside of the substrate 106 are not flat, but instead are pin shaped protrusions arranged in an array, and may connect to a socket mounted on the circuit board 102.

Furthermore, although most of the disclosed embodiments depict a single-piece frame, it will be understood by a person of ordinary skill in the art that the multi-pieced frames, such as those depicted in FIGS. 4 and 5, may be employed in the other depicted embodiments, and any other embodiments as claimed, without departing from the spirit or scope of the disclosed invention.

Figure 12:
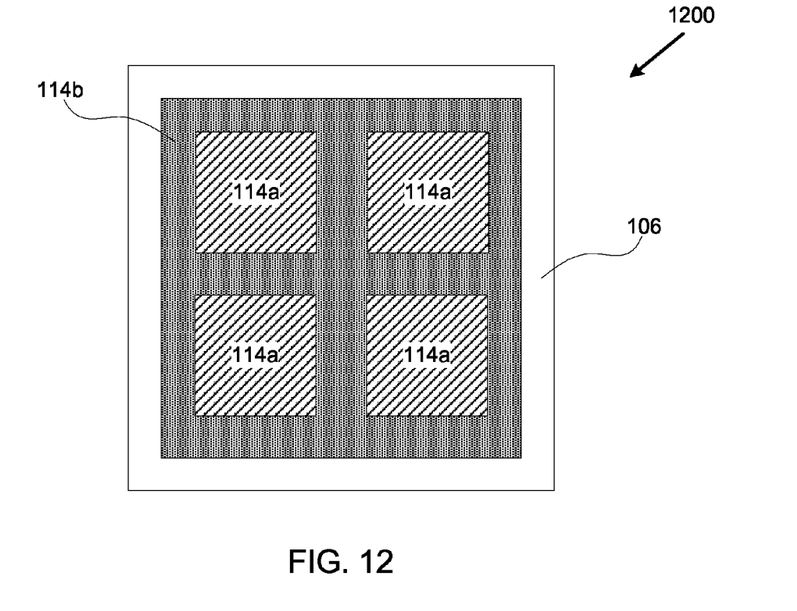
FIG. 12 is an aerial view of a multi-core processor having a series of heat spreading layers encased in a supporting frame, according to an embodiment of the disclosed invention.

Referring now to FIG. 12, a multichip module ("MCM") 1200 comprises four chips 112 (not shown) mounted onto a substrate layer 1200 (via, for example, a flip chip package) and thermally connected to respective heat spreading layers 114a, wherein the heat spreading layers 114a are encased in a supporting frame 114b. As described with respect to other embodiments of the invention (and FIGS. 4 and 5 in particular), above, the supporting frame may be formed as a single piece through, for example, a molding manufacturing process using a polymer; or it may be formed as multiple pieces using additional manufacturing methods, such as a high pressure metal press. According to one embodiment, the supporting frame 114b may comprise a top frame and a foot frame (not shown), similar to similarly referenced components depicted in FIGS. 4 and 5.

Figure 13:
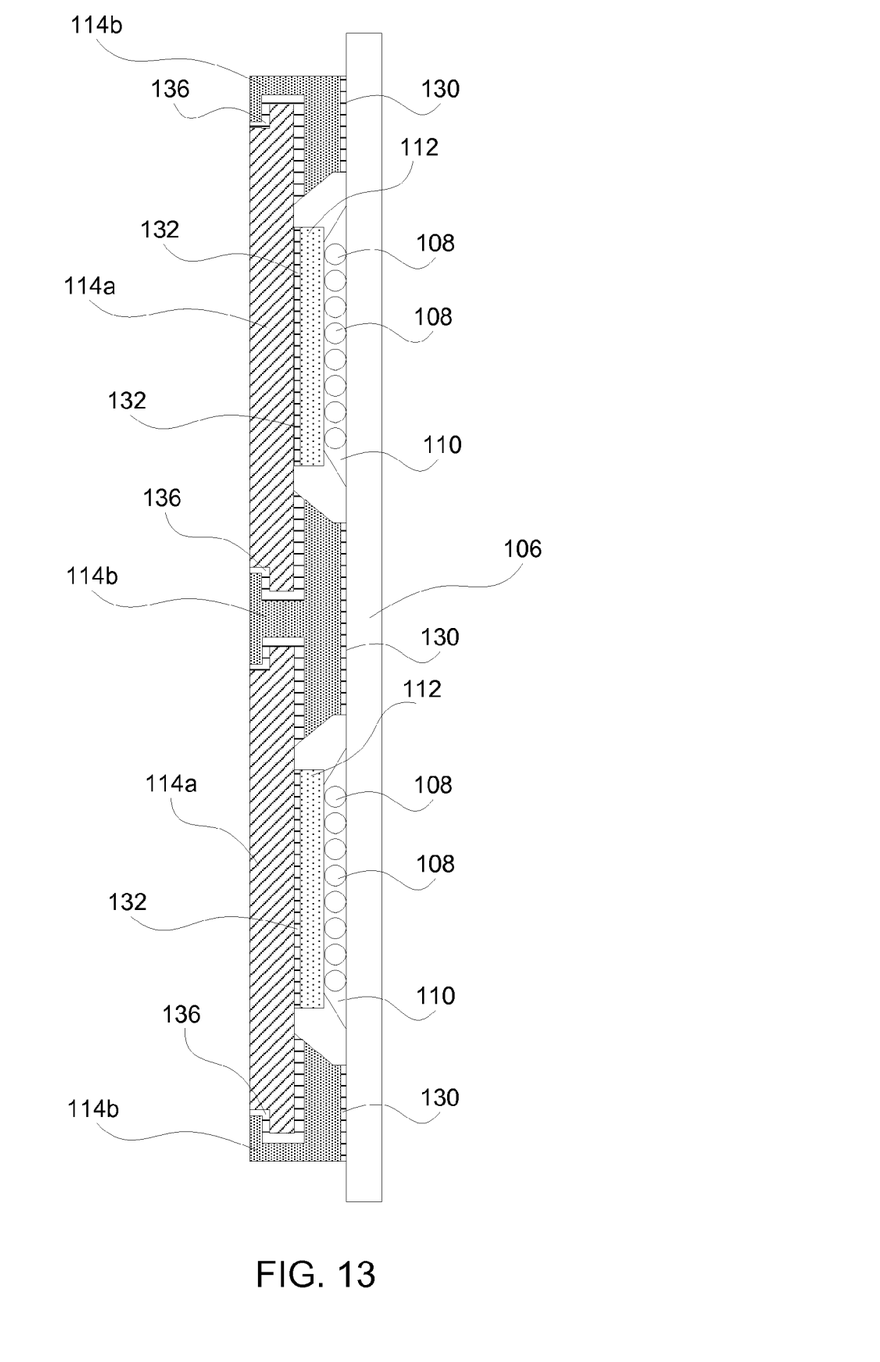
FIG. 13 is a partial cross sectional front elevational view of the multi-core processor depicted in FIG. 12.

Referring now to FIG. 13, the multichip module ("MCM") 1200 comprises additional sets of components beneath top surfaces of the supporting frame 114b and heat spreading layers 114a depicted in FIG. 12. According to the depicted embodiment, each set of components in the MCM 1200 is similar to the embodiment shown in FIG. 6, wherein like elements have been similarly referenced. According to the embodiment depicted in FIG. 13, each shared portion of the supporting frame 114b situated between each pair of chips 112 (making a total of four shared portions) is a continuous portion of the entire supporting frame 114b structure. According to related embodiments, each heat spreading layer 114a may be encased by a corresponding supporting frame 114b, wherein the supporting frames 114b are thermally or mechanically joined to one another to form the MCM 1200.

The disclosed invention, including the depicted embodiments, employ a single high-k layer supported by a frame having a stronger structural stability. By using a single graphite layer, for example, the disclosed invention allows for high heat dissipation across at least two planes, including the z plane, and at least the x or y planes. Consequently, the disclosed invention allows for effective thermal conduction overall across the entirety of the heat spreading layer, without sacrificing structural integrity or incurring a thermal penalty by covering the high-k material with another material having relatively low thermal conductivity. Embodiments of the disclosed invention increase the thermal conductivity of semiconductor packages in which they are employed, and allow for reliable operation in hygrothermal operating conditions, which include temperatures between −40° C. and 125° C., and as much as 85% relative humidity.

What is claimed is:

1. A cooling system for a semiconductor package comprising:
a heat spreading layer comprised of graphite partially encased in a supporting frame comprised of copper and wherein the heat spreading layer is affixed to the supporting frame with an adhesive layer, the heat spreading layer including a perimeter, the supporting frame being configured to encase the perimeter and an adjacent portion of the heat spreading layer, defining centrally exposed top and bottom portions of the heat spreading layer; and
a chip die thermally connected to the centrally exposed bottom portion of the heat spreading layer by a first thermal interface material, and further comprising a heat dissipating element thermally connected to a top surface of the heat spreading layer by a second thermal interface material, the heat dissipating element having a centrally protruding portion on a bottom surface thereof, wherein the centrally protruding portion is beveled.

* * * * *